United States Patent [19]

Hoeberechts

[11] 3,978,512
[45] Aug. 31, 1976

[54] SEMICONDUCTOR DEVICE FOR CONVERTING A RADIATION PATTERN INTO ELECTRIC SIGNALS

[75] Inventor: Arthur Marie Eugene Hoeberechts, Eindhoven, Netherlands

[73] Assignee: U.S. Philips Corporation, New York, N.Y.

[22] Filed: Feb. 5, 1973

[21] Appl. No.: 329,469

[30] Foreign Application Priority Data
Feb. 25, 1972 Netherlands............ 7202478

[52] U.S. Cl. .................................. 357/31
[51] Int. Cl.² ............... H01L 27/14; H01L 31/00
[58] Field of Search ............... 317/235 N, 235 NA; 178/7.1

[56] References Cited
UNITED STATES PATENTS
3,523,208  8/1970  Bodmer .............................. 315/10
3,612,954  10/1971  Silver .............................. 317/235 R
3,676,727  7/1972  Dalton .............................. 313/66
3,703,669  11/1972  London............................. 317/235 R
3,737,701  6/1973  Kooi ................................ 313/66
3,737,702  6/1973  Holberechts........................ 313/66

Primary Examiner—Martin H. Edlow
Attorney, Agent, or Firm—Frank R. Trifari; Carl P. Steinhauser

[57]  ABSTRACT

A semiconductor device, in particular a target and a camera tube, respectively, for color video signals, comprising a semiconductor body having a radiation-sensitive layer, a dielectric layer and indicator members to obtain an indexing signal. According to the invention, the indicator members comprise a surface region on which thickness of the dielectric layer is different from that on the adjoining parts of the surface.

15 Claims, 16 Drawing Figures

SEMICONDUCTOR DEVICE FOR CONVERTING A RADIATION PATTERN INTO ELECTRIC SIGNALS

The invention relates to a semiconductor device for converting a radiation pattern into electric signals, comprising a semiconductor body having a substrate region of one conductivity type provided with a connection conductor, which semiconductor body has a surface which is covered at least locally with a dielectric layer and comprises a radiation-sensitive layer adjoining said surface for converting incident radiation into an electric signal, which radiation-sensitive layer can be scanned by a beam of charged particles, at least one group of indicator members being present on the side of the said surface and, in the direction of the line scan, forming regions which are situated at regular intervals and which have an acceptance for the scanning beam which differs from that of the remaining part of the body.

Such a device is known, for example from the published Dutch Patent Application 7,104,476. This Application describes inter alia a camera tube for converting a color picture into a colour video signal in which a semiconductor body of the above-described type is used as a target. This target is formed by a plate-shaped n-type silicon substrate in which a radiation-sensitive layer comprising a mosaic of p-type surface zones is provided at a surface and each form a radiation-sensitive p-n junction with the adjoining n-type silicon. The said surface is covered with a dielectric layer of a homogenous thickness having apertures above the p-type zones and a strip-shaped metal layer having a longitudinal direction transverse to the line scanning direction and serving as an indicator member is provided between said zones on the dielectric layer.

In this known device, the indicator strips form two groups which, in the direction of the line scan, each have a distance center-to-center which differs from the distance center-to-center of the radiation-sensitive elements, in this case the p-type surface zones with associated p-n junctions. Every other strip of a group, viewed in the direction of scanning, is connected to a first conductor, the intermediate strips being connected to a second conductor. The two said conductors are electrically insulated from the substrate and are connected to a signal source which provides an alternating signal in the form of rectangular pulses which is synchronized with the line scan period and the pulse width of which is equal to the line scan period. During successive line scan periods, the indicator strips thus have a different potential which, however, is constant during the same line scan period. As a result of this, a given radiation-sensitive diode has a different acceptance for the scanning electron beam during successive line scan periods, as a result of which an indexing signal can be derived from a connection conductor which is connected to the substrate.

Acceptance is conventionally to be understood to mean herein that fraction of the total number of electrons which is directed to a surface part of the target which can reach said surface part, and said acceptance is determined by the electric field strength at and adjacent the surface part in question.

The said indexing signal therefore indicates a correlation between a certain line scan period and the group of diodes scanned during said period, and thus presents in principle the possibility of separating from each other signals associated with successive scenes recorded in different colours by placing different colour filters before the diodes scanned during successive line scan periods.

An important drawback of the described known device is that the information from which the colour signal for a given colour is obtained, is built up from the scanning of lines which are not adjacent since from the intermediate lines the information for the other colour or colours is obtained. This gives a considerable loss of resolving power.

Another drawback is that an extra alternating voltage source is necessary to obtain the indexing signal.

One of the objects of the invention is to provide a semiconductor device for converting a radiation pattern into electric signals which is suitable inter alia for recording a colour picture and in which the above-described drawbacks occurring in known devices do not occur or occur at least to a far smaller extent.

Another object of the invention is to provide a camera tube for converting a colour picture into a colour video signal in which only one target and one optical system is used and in which a high resolution is achieved together with low inertia while using a relatively simple circuit.

The invention is based inter alia on the discovery that by using acceptance differences caused at least partly by differences in the thickness of the dielectric layer, considerable circuit technical and technological advantages can be obtained.

Therefore, according to the invention, a semiconductor device for converting a radiation pattern into electric signals of the type heretofore described is characterized in that the radiation sensitive layer is provided with indicator members comprising a semiconductor surface region on which the thickness of the dielectric layer is different from the thickness of the dielectric layer present on the adjoining part of the surface.

In this connection it is to be noted that the said different thickness may mean a zero thickness, so that the dielectric layer at the said surface region is entirely absent. This, in other caes, may apply to the said adjoining parts of the surface on which, for instance, the dielectric layer may have a zero thickness, while the parts of the dielectric layer on the said surface regions associated with the indicator members do not have a zero thickness. The expression "different thickness" should be considered in the above wide meaning.

In contrast with the described known device, the indicator members according to the invention are not fully separated electrically from the substrate region but the scanning beam is connected electrically, at least for alternating current, to the connection conductor provided on the substrate region via an impedance which is formed entirely or partly by the substrate region and the said part of different thickness of the dielectric layer. As a result of this and as will be described in greater detail hereinafter, considerable advantages can be obtained, in particular a high resolution, since a point-after-point colour scan can be used instead of a line-after-line scan as in the known device; moreover, very important circuit technical advantages are obtained as will be described in detail hereinafter. Furthermore, the indicator members according to the invention can be very simple and may consist, for example, only of a local thinning of the dielectric layer. As a result of this, the acceptance at the area of an indicator member will be different from that on the adjoining area of the plate.

The radiation-sensitive layer may be, for example, a continuous coherent layer having such a thickness and resistivity that substantially no current can flow in a direction parallel to the layer, so that an element of the layer which is charged by a component of the radiation pattern behaves relative to the adjacent layer element as being electrically separated therefrom. However, the invention is of particular interest in the above-described case in which the radiation-sensitive layer comprises a mosaic of separated substantially identical radiation-sensitive elements which, at least in the direction of the line scan, lie at mutually equal center-to-center distances, the indicator members belonging to one group having a center-to-center distance in the direction of line scan which differs from the center-to-center distance of the radiation-sensitive elements. Actually, in this case the elements of which the radiation-sensitive layer is inter alia composed can technologically be obtained in a better reproducible manner, while also as a result of the electric separation of the elements, the resistance of the layer in the direction of the layer is substantially of no significance for said separation. Since furthermore the radiation-sensitive elements, at least in the direction of the line scan, lie at mutually the same center-to-center distance, the resolving power is not disturbed by the presence of the indicator members.

Although the surface regions having parts of different thickness of the dielectric layer belonging to the indicator members may also be present beyond the region of the mosaic destined for radiation conversion, as will become apparent, an important preferred embodiment is characterized in that the said surface regions with different thickness of the dielectric layer belonging to the indicator members are situated between the radiation-sensitive elements. In this case, the indicator members may be formed only by the said parts of different thickness so that the structure becomes very simple.

An important preferred embodiment according to the invention is characterized in that the indicator members comprise apertures in the dielectric layer. In the simplest embodiment the indicator members consist of said apertures only, but in some cases it may be of advantage to provide in the apertures on the semiconductor surface one or more layers of a material which differs from the dielectric layer, is insulating or is more or less readily conductive, for example, to obtain the desired acceptance by influencing the resistance between the electron beam and the substrate region.

According to a very suitable embodiment, the indicator members comprise rows of mutually separated apertures in the dielectric layer, which rows extend transversely to the direction of the line scan. A very simple embodiment is obtained when the apertures are formed by slots in the dielectric layer which extend transversely to the direction of the line scan.

According to another preferred embodiment, the indicator members comprise a part of the dielectric layer having locally a larger thickness than the adjoining parts of the layer. In this case also the acceptance at the area of the indicator member will be different from elsewhere on the plate.

As already noted, the indicator members may comprise, in addition to a surface region with a part of the dielectric layer having a different thickness, a conductive layer by means of which the indicator members can be brought, for example, at a suitable potential. It is particularly advantageous when the indicator members comprise conductive layers which extend transversely to the direction of line scan and which are connected to a common connection conductor. It is to be noted that the conductive layer and also the connection conductor may consist of a semiconductor material, for example, a polycrystalline silicon.

In certain circumstances, the structure described may advantageously be realized so that the conductive layers and connection conductors associated with at least two groups of indicator members constitute interdigitated, preferably comb-shaped patterns.

The indicator members may be connected to the connection conductor of the substrate region via a series resistor. This may be necessary, for example, to bring the indicator members at the desired potential relative to the connection conductor. The said series resistor can be formed in many manners, for example, by a resistor vapor-deposited on the dielectric layer, by a resistor diffused in the substrate region and provided with connection conductors, via an external resistor present outside the target, or in any other manner. According to an important preferred embodiment the series resistor is fully or partly formed by a part of a resistance layer which is provided over substantially the whole radiation sensitive area and which has a sheet resistance of at least $10^{12}$ ohm per square, usually referred to as "resistive sea" in the technical literature. Since in many cases such resistive sea is already present, this preferred embodiment can very simply be realized.

When the device serves as a target for converting a colour picture into electric signals in which a colour filter is placed in front of each element, it will be desirable in many cases upon scanning successive colours to obtain a run-in signal which denotes the beginning of a line scan period. From said run-in signal the colour with which a signal originating from a given radiation-sensitive element corresponds may be deduced.

Such a run-in signal may be obtained, for example by means of a circuit which is present outside the semiconductor body. However, a very important preferred embodiment is characterized in that, taken in the direction of line scanning, a run-in structure is provided, preferably outside the mosaic serving for radiation conversion, in a row of radiation-sensitive elements, as a result of which an acceptance variation is produced which gives rise to a run-in signal indicating the beginning of a line scan period. In this manner a run-in signal is obtained in a very simple manner by means of a run-in structure which may be chosen arbitrarily and can be obtained simultaneously with other parts of the semiconductor body by means of the same methods.

Although the device according to the invention may also be used for converting, for example, radiation patterns obtained by guiding light through punched cards or of patterns of particles of radiation (corpuscular radiation), the device is of particular interest as a target for use in a camera tube for displaying colour video signals. In connection herewith the invention furthermore relates in particular to a camera tube for recording colour video signals comprising an electron source which can produce an electron beam, a target formed by the said semiconductor body which can be scanned by solid electron beam, and strip-shaped colour filters on the side of the incident radiation which each expose a strip of the radiation-sensitive layer extending in a direction transverse to the line scanning direction only to radiation passed by one filter.

The invention will now be described in greater detail with reference to a few examples and the drawing, in which.

Figure 1:
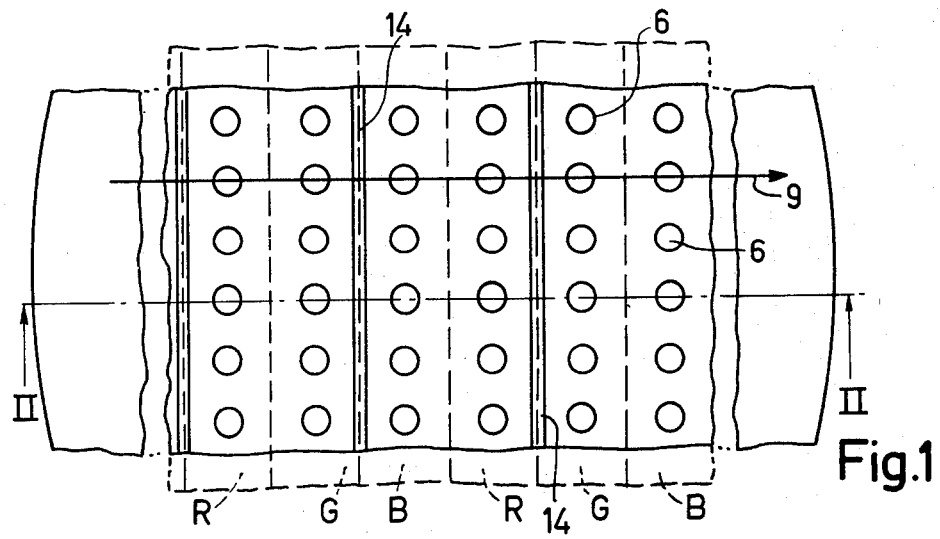
FIG. 1 is a plan view of a device according to the invention.
Figure 2:
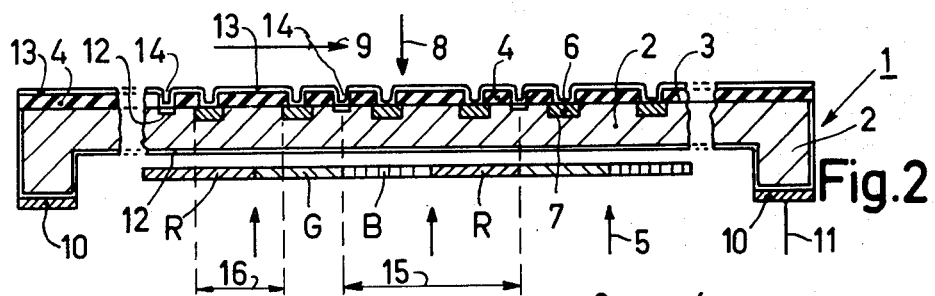
FIG. 2 is a diagrammatic cross-sectional view of FIG. 1 taken on the line II—II
Figure 3:
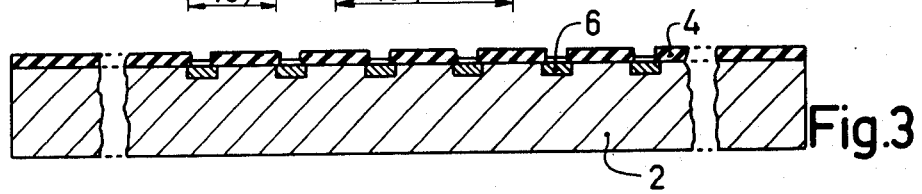
Figure 4:
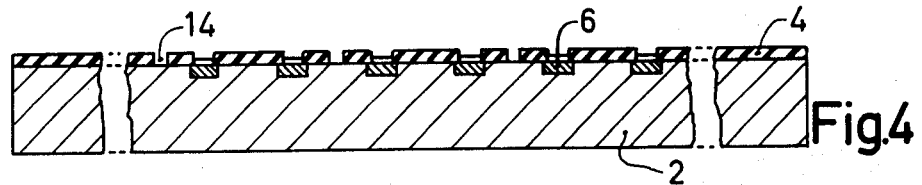
Figure 5:
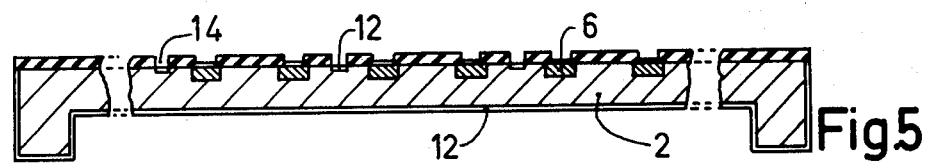
Figure 6:
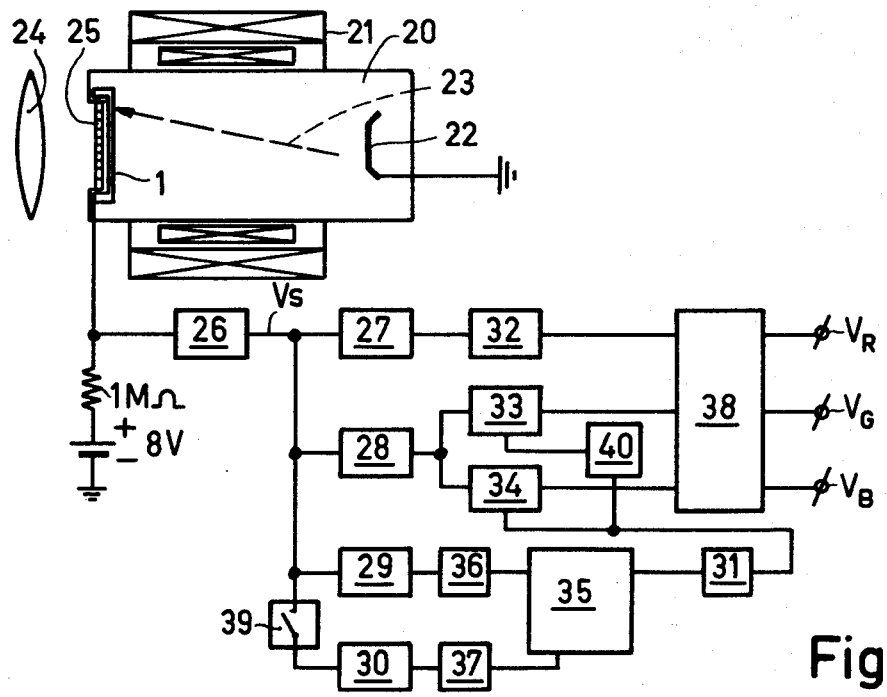
Figure 7:
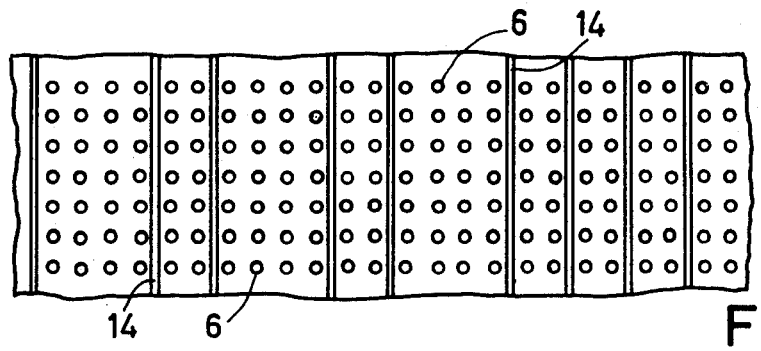
Figure 8:
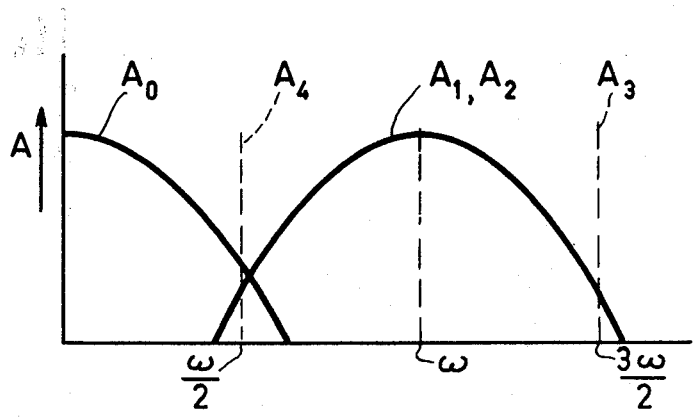
Figure 9:
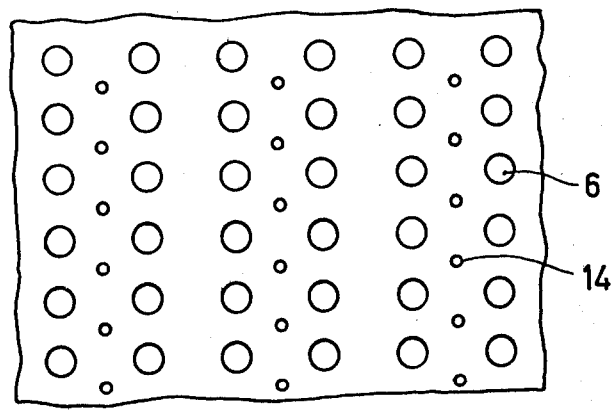
Figure 10:
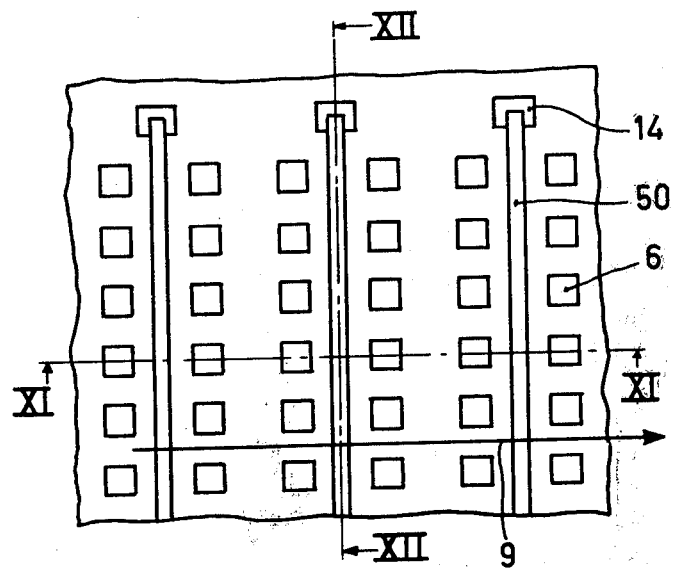
Figure 11:
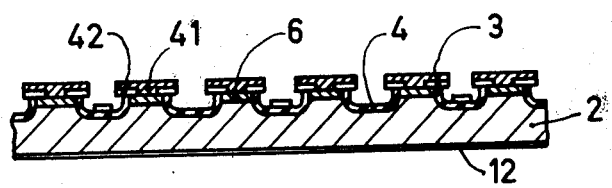
Figure 12:
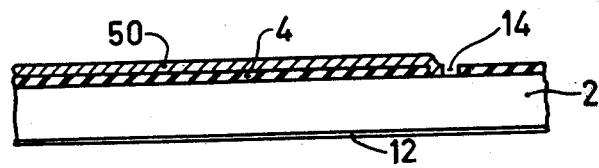
Figure 13:
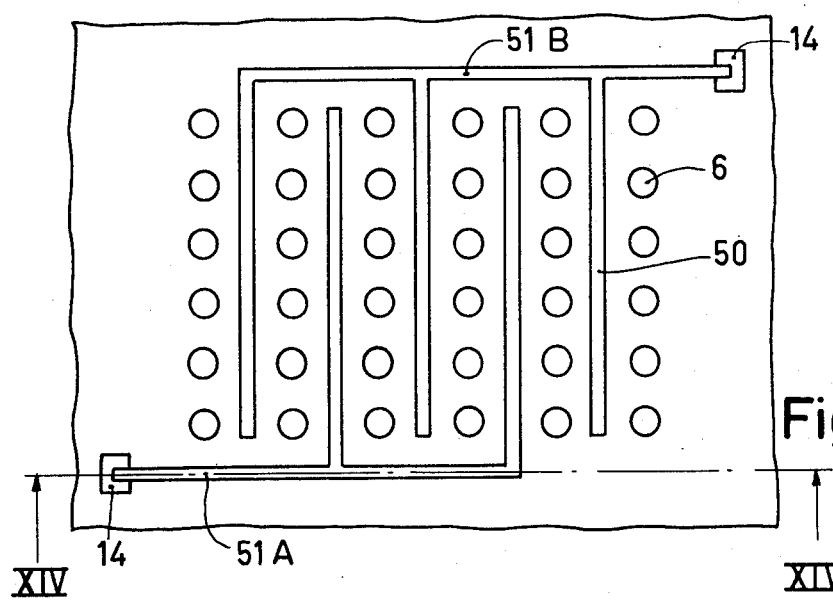
Figure 14:
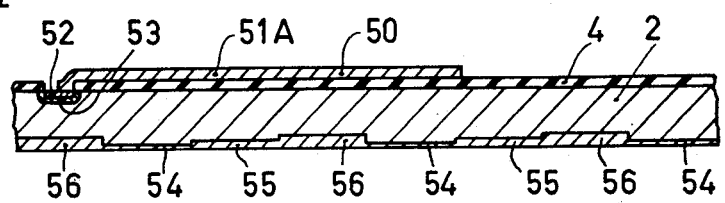
Figure 15:
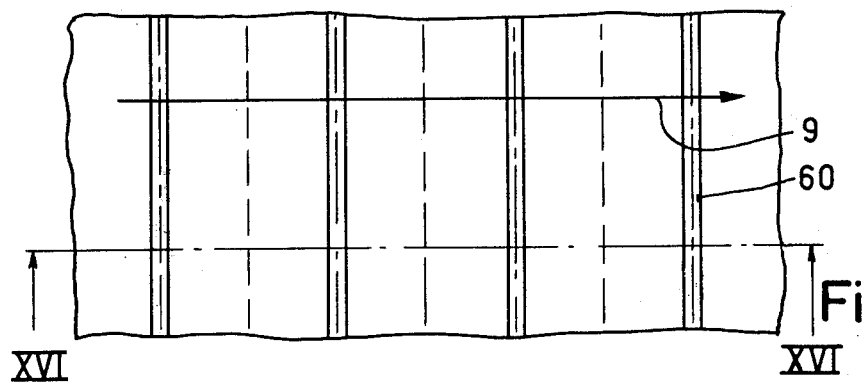
Figure 16:
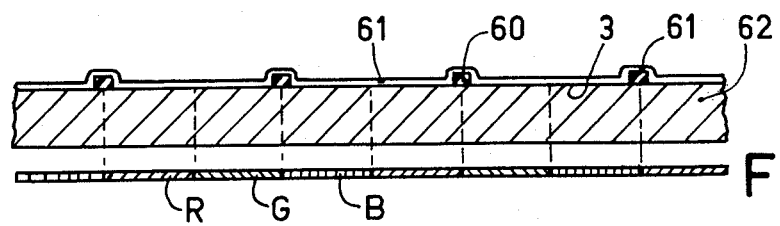

FIGS. 3 to 5 are cross-sectional views of the device of FIGS. 1 and 2 taken on the line II—II during successive stages of manufacture, FIG. 6 shows diagrammatically a camera tube according to the invention incorporated in a circuit, FIG. 7 is a plan view of a run-in structure, FIG. 8 shows the signal amplitude as a function of the angular frequency $\omega$ for various signals obtained according to the invention, FIG. 9 is a plan view of another device according to the invention, FIG. 10 is a plan view of another device according to the invention, FIGS. 11 and 12 are diagrammatic cross sectional views of the device shown in FIG. 10 taken on the lines XI—XI and XII—XII, FIG. 13 is a plan view of a further device according to the invention, FIG. 14 is a diagrammatic cross-sectional view of the device shown in FIG. 13 taken on the line XIV—XIV, FIG. 15 is a plan view of still another device according to the invention, and FIG. 16 is a diagrammatic cross-sectional view of the device shown in FIG. 15 taken on the line XVI—XVI.

The Figures are diagrammatic and not drawn to scale. Corresponding parts are generally referred to by the same reference numerals in the Figures.

FIG. 1 is a diagrammatic plan view of a part of a semiconductor device according to the invention and FIG. 2 is a diagrammatic cross-sectional view of FIG. 1 taken on the line II—II. In this example, the device comprises a target for a colour video camera tube destined for converting a radiation pattern into electric signals. The target comprises a semiconductor body 1 of n-type silicon having an n-type substrate region 2 which is provided with an annular ohmic contact 10 and a connection conductor 11. The semiconductor body has a surface 3 which is locally covered with a dielectric layer 4 of silicon dioxide. The body furthermore comprises a radiation-sensitive layer for converting into an electric signal radiation which is incident in the direction of the arrows 5. The radiation-sensitive layer comprises a mosaic of separated, substantially identical radiation-sensitive elements in the form of diodes which consist of p-type zones 6 which are diffused in the body and which form p-n junctions 7 with the substrate region 2. These diodes form capacitances which are scanned by an electron beam (see arrow 8) in the direction of line scanning 9 and are charged to a given voltage. As a result of charge carriers generated in the semiconductor body by the incident radiation 5, the diodes are discharged to a greater or lesser extent and the different extent of discharge is measured in the form of variations which occur in the current strength of the electron beam 8 during the next following line scan period and which are measured between the connection conductor 11 and the cathode of the electron source. The diodes (6/2) in the direction 9 of line scanning lie at mutually the same center-to-center distance.

On the side of the incident radiation 5, a series of strip-shaped filters R, G, B are placed in front of and substantially against the target and pass successively a red, green, and blue wavelength range, so that, viewed in the direction 9 of line scanning, light of different colours impinges upon successive diodes. A thin diffused highly doped n-type layer 12 is provided over the entire surface of the target on the side of the filter. On the other side the target is covered by a layer 13 of antimony trisulphide ($Sb_2S_3$) having a thickness of approximately 0.2 $\mu$m and a sheet resistance of approximately $10^{14}$ ohm per square. This layer has a high resistance in a direction parallel to the layer and serves to prevent the charging of the oxide layer 4 by the electron beam.

In order to determine behind which filter strip a given diode scanned during a line scanning period is present, indicator members 14 are furthermore provided on the target between the diodes and, in the direction of line scanning 9, form regions which are present at regular distances and which have an acceptance for the scanning beam which differs from that on the remaining parts of the target. The resulting current variations of the electron beam 8 give rise to an indexing signal as a result of which the pictures associated with the various types of filters can be separated.

According to the invention the indicator members 14 comprise a semiconductor surface region on which the thickness of the dielectric layer 4 differs from the thickness of the dielectric layer 4 present on the adjoining parts of the surface 3. In the present example the indicator members are formed in a very simple manner by parts of the dielectric layer having a zero thickness, that is to say by apertures in the dielectric layer 4, in the form of slots 14 extending transversely to the direction 9 of line scanning. Taken in the direction 9 of line scanning the indicator members 14 have a center-to-center distance 15 which is twice as large as the center-to-center distance 16 of the radiation-sensitive diodes (6/2), and are connected to the diodes (6/2) via the resistance layer 13, the resistance formed by the layer 13 being so high that as a result substantially no information can leak away from the diode to the indicator member.

The target described may be manufactured, for example, as follows, see FIGS. 2 to 5. Starting material (see FIG. 3) is an n-type silicon plate 2, diameter 25 mm, resistivity 10 ohm cm, thickness 200 microns. This plate is polished and cleaned and then thermally oxidized in known manner until an oxide thickness of 1 micron is achieved. A photoresist mask is then provided having windows of 10 microns diameter and a center-to-center distance of 25 microns in the direction of line scanning and 17 microns at right angles to the said direction, the parts of the oxide layer 4 present within the windows being then etched away. Through the resulting windows in the oxide, boron is then indiffused to a depth of 2 microns with a sheet resistance of 200 ohms per square, thus forming the regions 6 (FIG. 3).

While using a fresh photoresist mask, slots 14 having a width of 3 microns and a center-to-center distance of 50 microns are then etched in the oxide layer. The silicon plate is then etched thin, with the exception of a 1 mm wide region at the edge, to an ultimate thickness of 10 microns (FIG. 5). By a 0.2 micron deep phosphorus contact diffusion 12, highly doped n-type surface layers are provided in the slots 14 and on the opposite side of the disc (FIG. 5).

The glass layer formed during the boron diffusion is then etched off the diodes and the plate is subjected to an annealing treatment at 400°C for 1 hour in moist nitrogen. An approximately 0.1 micron thick layer of $Sb_2S_3$ is then vapor-deposited on the side of the diodes over the entire area. (See FIG. 2).

The resulting target is mounted in a camera tube and provided with a contact layer 10 and a connection conductor 11. This camera tube is shown diagrammatically in the block diagram of FIG. 6 and may be incorporated in a circuit, for example, in the manner shown in said Figure. Reference numeral 20 denotes the camera tube which is provided with focusing and deflection coils 21 and an electron source in the form of an electron gun 22 which can produce an electron beam 23 with which the target 1 is scanned. The strip-shaped colour filters 25 denoted by R, G, B in FIGS. 1 and 2 are provided on the side of the radiation which is incident on the target 1 via the optical system 24, which filters expose a strip of the radiation-sensitive layer extending in a direction transverse to the direction of line scanning and the row of radiation-sensitive elements present therein only to radiation which is passed by one filter.

The further components of the circuit have the following meaning.

26 = pre-amplifier
27 = low pass filter
28 – 31 = bandpass filters
32 = delay line
33, 34 = multiplication circuits
35 = multiplication and division circuit
36, 37 = amplitude limiters
38 = matrix circuits.
39 = electronic switch, closed during run-in scanning time and for the rest opened
40 = phase shift 90°.

It will now be described in greater detail with reference to the circuit shown in FIG. 6 why the use of a device according to the invention also provides important circuit technical advantages. As a matter of fact, the structure of a target according to the invention inter alia permits obtaining an indexing signal which is substantially independent of the intensity of the radiation pattern impinging upon the target.

The signal $V_s$ (see FIG. 6) derived from the output of a preamplifier 26 has the form:

$$V_s = A_0 + A_1 \sin \omega t + A_2 \cos \omega t + A_3 \cos (\frac{m}{n} \omega t + \phi) + A_4 \cos (\frac{\omega t}{n} + \psi), \quad (1)$$

wherein $A_0$, $A_1$ and $A_2$ are linear combinations of the desired output colour signals,
$A_3$ = the amplitude of the indicator carrier wave
$A_4$ = the amplitude of a run-in carrier wave
$\phi$ and $\psi$ = phase angles
$\omega$ = angular frequency of the colour carrier wave
$t$ = time
$m$ and $n$ = integers, where $m \neq n$.

The ratio $m/n$ denotes the ratio of the center-to-center distance between the radiation-sensitive elements for the same colour and the center-to-center distance of the indicator members. By using a target according to the invention as described above, $A_3$ becomes substantially independent of the intensity of the radiation pattern since the indicator members, as a result of the high resistance in series with the electron beam which they represent, behave substantially as a current source which produces the indicator signal.

The substantial independence of $A_3$ of the light intensity moreover provides the advantage that the indicator frequency $m/n \, \omega$ comprises substantially no undesired modulation product which might have a disturbing influence on the colour signal band.

In the above-described example $m$ is chosen to be equal to 3 and $n$ equal to 2. The run-in signal is obtained by run-in structures preferably provided beyond the surface covered by the radiation pattern. Such a run-in structure can be formed in many ways- and is a structure with acceptance variations which have a frequency which differs from that of the remaining radiation-sensitive mosaic with indicator members. In the example described a run-in structure is obtained by omitting at the edge of the plate a few times every third indicator slot, see FIG. 7 which is a diagrammatic plan view of a part lying near the edge.

FIG. 8 shows diagrammatically for the example described the luminance or video band ($A_0$), the colour frequency band or chrominance band ($A_1$, $A_2$), the run-in frequency ($A_4$) and the indicator frequency ($A_3$). Attention is drawn to the fact that the indicator frequency $A_3$ lies far beyond the $A_0$, $A_1$ and $A_2$ maxima and that the indicator signal can therefore be easily filtered out, in contrast with known structures.

It is to be noted that in certain cases $m$ may be chosen equal to 1 and $n$ equal to 2. In this case, which is to be preferred when the luminance band and the chrominance band do not substantially overlap each other, it appears from formula (1) that the term $A_4 \cos$ $$(\frac{\omega t}{n} + \psi),$$

the run-in term, is superfluous since the frequency ½ $\omega$ determined by it is already supplied by the $A_3$-term and the frequency $\omega$ can therefore be simply obtained by doubling the indicator frequency. So in this case run-in structures are superfluous.

As will be obvious, the indicator members 14 from the example described need not have slot-like apertures in the oxide layer 4. The apertures 14 may also consist, for example, of rows of holes in the dielectric layer which are separated from each other and extend transversely to the direction 9 of line scanning, as is shown in the partial plan view of FIG. 9.

FIG. 10 is a diagrammatic plan view and FIGS. 11 and 12 are diagrammatic cross-sectional views taken on the lines XI—XI and XII—XII of FIG. 10 of another device according to the invention. As in FIGS. 1 and 2, these Figures again show a silicon target having an n-type substrate 2 on which, however, in this example no planar diodes but mesa diodes are provided in the form of p-type zones 6 which constitute p-n junctions 7 with the n-type substrate region 2, said junctions being covered at the surface by a layer 4 of silicon oxide. Only a very small part of the total number of diodes is shown.

The metal flaps 41 present on oxide part 42 serve to prevent the charging of the oxide layer 4 by the electron beam and are not shown in FIG. 10 to avoid complexity of the drawing.

In this case the indicator members comprise, besides surface regions within apertures 14 in the oxide layer 4, conductive layers 50, the layers 50 extending transversely to the direction 9 of line scanning of the electron beam and adjoining the substrate region 2 via the apertures 14 (in this case present beyond the radiation pattern). The conductive layers 50 may consist of a metal, for example aluminum, or of a semiconductor, for example, polycrystalline silicon, which is preferably doped. In this case also, the indicator members (40, 50) in the direction 9 of line scanning constitute regions which have an acceptance for the scanning electron beam different from that of the remaining part of the target. 12 again denotes an n-type contact layer.

In FIGS. 10 to 12 each conductive strip 50 is connected to the substrate region 2 via a separate aperture 14 in the oxide layer. Another embodiment is shown diagrammatically in FIGS. 13 and 14, in which FIG. 13 is a partial plan view and FIG. 14 a diagrammatic cross-sectional view taken on the line XIV—XIV of FIG. 13. The conductive strips 50 constitute two groups which adjoin connection conductors 51A and 51B, respectively, and constitute two interdigitated combs. The connection conductors 51A and 51B adjoin the silicon surface via apertures 14 in the oxide layer 4. In this case the conductor 51A (see FIG. 14) is connected to the substrate region via a transistor formed by an n-type zone 52, a p-type zone 53 and the n-type substrate 2. The other conductor 51B is connected to the substrate region via a diode in that below the window 14 near the conductors 51B the zone 52 (see FIG. 14) is lacking and only a p-type zone 53 is present.

In this example, two combs are provided which are connected to the substrate 2 in different ways. As a result of this, said combs will always show a certain potential difference as a result of which also in the case of over-exposure in which the acceptance difference between the indicator regions and the remaining surface is substantially eliminated, an indexing signal is obtained.

It is also shown in FIG. 14 that the colour filters may be provided, if desirable, integrated in the semiconductor body. In this case, highly doped n-type strips 54, 55 and 56 are successively provided to different depths. As a result of the absorption in the $n^+$ material, for example, red + green + blue is passed by the parts 54, only red + green is passed by the parts 55 and only red is passed by the parts 56.

FIG. 15 is a plan view and FIG. 16 is a cross-sectional view taken on the line XVI—XVI of an example in which the indicator members comprise regions 60 of the dielectric layer having a larger thickness than elsewhere on the surface 3 instead of locally present regions of the dielectric layer 4 with smaller thickness than the remaining parts of the layer 4, for example, the apertures 14 in the examples of FIGS. 1 to 14. In this example the oxide layer is provided only at the area of the strip-shaped regions 60 which extend transversely to the direction 9 of line scanning, see FIG. 15.

In this example, the radiation-sensitive layer 61 is formed by a continuous layer of high-ohmic $Sb_2S_3$, 0.5 micron thick, which is deposited on an n-type substrate 62 of silicon and forms a hetero-junction with it. The layer 61 in a direction parallel to the layer has such a high resistance that the parts of the layer 61 corresponding to the colour filters (R,G,B) and separated by the broken line may be considered in practice as electrically separated radiation-sensitive elements.

It will be obvious that the invention is not restricted to the embodiments described but that many variations are possible to those skilled in the art without departing from the scope of this invention. For example, the characteristic features of the 5 examples of FIGS. 1 to 9, FIGS. 10 to 12, FIGS. 13 to 14 and FIGS. 15 and 16 can be combined with each other in a variety of manners. Notably, the structure of FIG. 16 and also that of FIG. 9 may be used instead of the diode structure in any of the other examples, and conversely. Furthermore, in FIG. 13 only one of the two comb structures may be used instead of two, in which moreover the ends of the strips 50 which are free in FIG. 13 may also be connected by a conductive strip, as a result of which the comb structure changes into a grid structure. On the analogy of FIG. 14, even two interdigitating grid structures may be used, in which, of course, an insulating layer must be present between crossing conductors.

In the examples of FIGS. 1 to 14, instead of apertures extending to the semiconductor surface, the regions 14 of different thickness of the dielectric layer 4 may also be thicker or thinner regions of the oxide layer obtained, for example, by carrying out, in the stage of FIG. 4, the etching of the oxide layer 4 in a different way. The parts of different thickness of the dielectric layer associated with the indicator members need not consist of the same material as the remaining parts of the dielectric layer.

The dielectric layer, the semiconductor regions and the conductive layers may consist of materials other than those which are mentioned in the examples. In so far as the indicator members comprise apertures in the dielectric layer, as in FIGS. 1 to 14, said apertures 14 may either directly adjoin the substrate region 2 (FIG. 12) or be connected to the substrate region via a contact diffusion (12, FIG. 2) via a series resistor provided in or on the body, for example, a diffused series resistor or a series resistor present on the oxide, via a p-n-diode, via a transistor (52-53-2, FIG. 14), via a resistive sea, or in any different manner.

Furthermore, the circuit arrangement shown in FIG. 6 may also be used in camera tubes having targets as shown in FIGS. 9 to 16, although other circuits are also possible.

The run-in structures used may in principle be formed by any local configuration of indicator member-elements and/or radiation-sensitive elements having a periodicity other than on the remaining area of the semiconductor plate. For example, in the examples of FIGS. 10 and 13, run-in structures may be formed by providing the conductive strips 50 at the edge of, and preferably entirely beyond, the radiation pattern, at a larger distance than elsewhere.

Instead of light, electron beams originating from photocathodes which are sensitive to several colours may discharge the radiation-sensitive elements of the target. The radiation-sensitive elements may also be placed at mutual distances different from in the examples described and notably at smaller center-to-center distances so as to increase the resolving power.

What is claimed is:

1. A semiconductor device for converting a radiation pattern into electric signals, comprising a semiconductor body having a substrate region of one conductivity type, a conductor connected to said substrate region, a dielectric layer covering portions of one surface of said semiconductor body, a radiation-sensitive layer adjoining said surface for converting incident radiation into an electric signal by scanning said radiation-sensitive layer line-by-line with a beam of charged particles, at least one group of indicator members on the side of the said surface and, in the direction of the line scan, forming regions which are present at regular intervals and which have an acceptance for the scanning beam which differs from that of the remaining part of the body, said indicator members being electrically connected to the substrate region and comprising semiconductor surface regions on which the thickness of the dielectric layer is different from the thickness of the dielectric layer present on adjoining parts of the semiconductor surface.

2. A semiconductor device as claimed in claim 1, wherein the radiation-sensitive layer comprises a mosaic of separated substantially identical radiation-sensitive elements which, at least in the direction of the line scan, lie at mutually equal center-to-center distances, the indicator members which belong to one group having a center-to-center distance in the direction of line scanning which differs from the center-to-center distance of the radiation-sensitive elements.

3. A semiconductor device as claimed in claim 2, wherein the said surface regions with different thickness of the dielectric layer belonging to the indicator members are situated between the radiation-sensitive elements.

4. A semiconductor device as claimed in claim 1 where the semiconductor surface regions having the dielectric layer has apertures therein forming the indicator members.

5. A semiconductor device as claimed in claim 4, wherein the indicator members comprise rows of mutually separated apertures in the di-electric layer which extend transversely to the direction of the line scan.

6. A semiconductor device as claimed in claim 4, wherein the apertures are formed by slots in the dielectric layer which extend transversely to the direction of the line scan.

7. A semiconductor device as claimed in claim 1, wherein the indicator members comprise portions of the dielectric layer having locally a larger thickness than the adjoining parts of the dielectric layer.

8. A semiconductor device is claimed in claim 1 wherein in addition to a surface region with a part of the dielectric layer having a different thickness, the indicator members comprise a conductive layer.

9. A semiconductor device as claimed in claim 1 wherein the indicator members comprise conductive layers extending on the dielectric layer and transversely to the direction of the line scan and which are connected to a common connection conductor through an aperture in the dielectric layer.

10. A semiconductor device as claimed in claim 9, wherein the conductive layers and connection conductors associated with at least two groups of indicator members constitute interdigitated patterns.

11. A semiconductor device as claimed in claim 1 wherein the indicator members of at least one group are connected, via a series resistor, to the connection conductor provided on the substrate region.

12. A semiconductor device as claimed in claim 11, wherein the series resistor is formed by a part of a resistance layer which is provided over substantially the whole radiation sensitive area and which has a sheet resistance of at least $10^{12}$ ohm per square.

13. A semiconductor device as claimed in claim 2, wherein taken in the direction of line scanning a run-in structure is provided, in a row of radiation-sensitive elements, as a result of which an acceptance variation is produced in order to generate a run-in signal which indicates the beginning of a line scan period.

14. A semiconductor device as claimed in claim 1 wherein the device is a target formed by the said semiconductor body for a camera tube for displaying colour video signals.

15. A semiconductor device as claimed in claim 14, wherein the device is a camera tube for recording colour video signals including an electron source which can produce an electron beam, a target formed by the said semiconductor body which can be scanned by said electron beam, and strip-shaped colour filters on the side of the incident radiation which each expose a strip of the radiation-sensitive layer extending in a direction transverse to the direction of line scanning only to radiation passed by one filter.

* * * * *